United States Patent
Murata et al.

(10) Patent No.: US 7,779,313 B2
(45) Date of Patent: Aug. 17, 2010

(54) TESTING APPARATUS AND TESTING METHOD

(75) Inventors: Kiyoshi Murata, Tokyo (JP); Tomoyuki Sugaya, Tokyo (JP); Sami Akhtar, Tokyo (JP)

(73) Assignee: Advantest Corporation, Tokyo (JP)

( * ) Notice: Subject to any disclaimer, the term of this patent is extended or adjusted under 35 U.S.C. 154(b) by 331 days.

(21) Appl. No.: 12/058,756

(22) Filed: Mar. 30, 2008

(65) Prior Publication Data
US 2009/0249135 A1 Oct. 1, 2009

(51) Int. Cl.
*G06F 11/00* (2006.01)
*G01R 31/26* (2006.01)

(52) U.S. Cl. .............. 714/715; 714/735; 714/738; 324/765

(58) Field of Classification Search ............ 714/715, 714/735, 738; 324/765
See application file for complete search history.

(56) References Cited

U.S. PATENT DOCUMENTS

| | | | |
|---|---|---|---|
| 4,639,919 A * | 1/1987 | Chang et al. ............ | 714/743 |
| 6,021,515 A * | 2/2000 | Shimura ................. | 714/738 |
| 6,028,439 A * | 2/2000 | Arkin et al. ............. | 324/765 |
| 7,003,697 B2 * | 2/2006 | Magliocco .............. | 714/25 |

FOREIGN PATENT DOCUMENTS

| | | |
|---|---|---|
| JP | 10319089 | 12/1998 |
| JP | 2002189632 | 7/2002 |
| JP | 2005249735 | 9/2005 |

OTHER PUBLICATIONS

Koo et al., A Testing Methodology for New-Generation Specialty Memory Devices, 1989, IEEE, Paper 20.3, pp. 452-460.*

* cited by examiner

*Primary Examiner*—John J Tabone, Jr.
(74) *Attorney, Agent, or Firm*—Jianq Chyun IP Office

(57) ABSTRACT

Provided is test apparatus with higher testing efficiency, including: plurality of pattern generating sections generating test pattern to supply to devices under test; group control section controlling group of pattern generating sections out of the pattern generating sections, and generating control signal upon receiving signal output from any pattern generating section controlled; range information storage section storing range information indicating range of pattern generating sections, out of the pattern generating sections, that serve to test one independent device under test; and comprehensive control section receiving the control signal from the group control section, identifying any pattern generating section that supplies the test pattern to the same device under test as that to which the pattern generating section having output the signal supplies the test pattern based on the range information, and in response to the control signal, controlling any other group control section that controls the identified pattern generating section.

7 Claims, 5 Drawing Sheets

TESTING APPARATUS AND TESTING METHOD

BACKGROUND

1. Technical Field

The present invention relates to a test apparatus and test method. Particularly, the present invention relates to a test apparatus and test method suitable for testing a large number of relatively small-size semiconductor devices.

2. Description of the Related Art

Japanese Patent Application Publication No. 2005-249735 discloses a pattern generator and a testing apparatus which are capable of efficiently generating a continuous test pattern used for testing an electronic device. The pattern generator disclosed in the above publication first stores test data blocks onto a cache memory in an order designated by designation information, and then sequentially outputs the test data blocks stored on the cache memory as a test pattern. According to the above publication, a single controller controls a plurality of pattern generators, and the pattern generators under the control of the controller test a single independent electronic device. This means that the pattern generators controlled by the single controller receive a single piece of designation information and that each pattern generator may not be capable of generating a test pattern independently.

When the pattern generators configured in the above manner are utilized to test a relatively small-size electronic device, that is to say, an electronic device with a small number of test target terminals, the number of the pattern generators controlled by the single controller may sometimes be larger than the number of the test target terminals. In other words, one or more redundant pattern generators may not be connected to the test target terminals to be tested and thus not used, which may in turn lower the overall testing efficiency of the testing apparatus.

SUMMARY

Therefore, it is an object of an aspect of the innovations herein to provide a test apparatus and test method, which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary test apparatus includes: a plurality of pattern generating sections that generate a test pattern to supply to devices under test; a group control section that controls a group of pattern generating sections out of the plurality of pattern generating sections, and generates a control signal upon receiving a signal output from any pattern generating section controlled by itself; a range information storage section that stores range information indicating a range of pattern generating sections, out of the plurality of pattern generating sections, that serve to test one independent device under test; and a comprehensive control section that receives the control signal from the group control section, identifies any other pattern generating section that supplies the test pattern to the same one device under test to which the pattern generating section having output the signal supplies the test pattern, based on the range information, and in response to the control signal, controls any other group control section that controls the any other pattern generating section.

Each of the pattern generating sections may include a comparing section that compares an expectation value pattern, expected to be output from the device under test when the device under test is supplied with the test pattern, with an output pattern actually output from the device under test when the device under test is supplied with the test pattern. In this case, each of the group of pattern generating sections may notify the group control section of the signal, which is fail information generated when the comparing section detects as a result of comparison that the expectation value pattern and the output pattern do not match. Upon receiving the control signal, which is the fail information, from the group control section, the comprehensive control section may control the any other group control section to stop the any other pattern generating section controlled by the any other group control section.

The test apparatus may include a result storage section in each of the plurality of pattern generating sections that stores a test result including the fail information, and the comprehensive control section may receive the fail information from the group control section, and control the any other group control section to store the fail information in the result storage section in any pattern generating section controlled by the any other group control section. When more than one of the devices under test that are each supplied with the test pattern from any of the group of pattern generating sections controlled by the group control section should be all stopped from being tested, the comprehensive control section may control the group control section to stop all the pattern generating sections controlled by the group control section.

Each of the group of pattern generating sections may notify the group control section of the signal, which is a match signal generated when an output pattern output from the device under test in response to the test pattern satisfies a predetermined condition. In this case, upon receiving the match signal from the group control section, the comprehensive control section may control the any other group control section to cause the any other pattern generating section controlled by the any other group control section to perform a predetermined operation prepared for when the predetermined condition is satisfied.

The test apparatus may further include an intra-group range information storage section that stores intra-group range information indicating a range of pattern generating sections, out of the pattern generating sections controlled by the group control section, that serve to test any other independent device under test. Upon receiving the signal from the pattern generating section, the group control section may identify any other pattern generating section that is controlled by the group control section and that supplies the test pattern to the same any other device under test as that to which the pattern generating section having output the signal supplies the test pattern, based on the intra-group range information, and in response to the signal, control the any other pattern generating section controlled by the group control section.

According to the second aspect related to the innovations herein, one exemplary test method includes: a pattern generating step of generating a plurality of test patterns to supply to devices under test, where the generating is performed by a plurality of pattern generating sections; a group controlling step of controlling a group of pattern generating sections out of the plurality of pattern generating sections, and generating a control signal upon receiving a signal output from any pattern generating section controlled, where the controlling and the generating are performed by a group control section; a range information storing step of storing range information indicating a range of pattern generating sections, out of the plurality of pattern generating sections, that serve to test one independent device under test; and a comprehensive controlling step of receiving the control signal generated in the group controlling step, identifying any other pattern generating section that supplies the test pattern to the same one device under test as that to which the pattern generating section having output the signal supplies the test pattern based on the range information, and in response to the control signal, controlling any other group control section that controls the any other pattern generating section.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
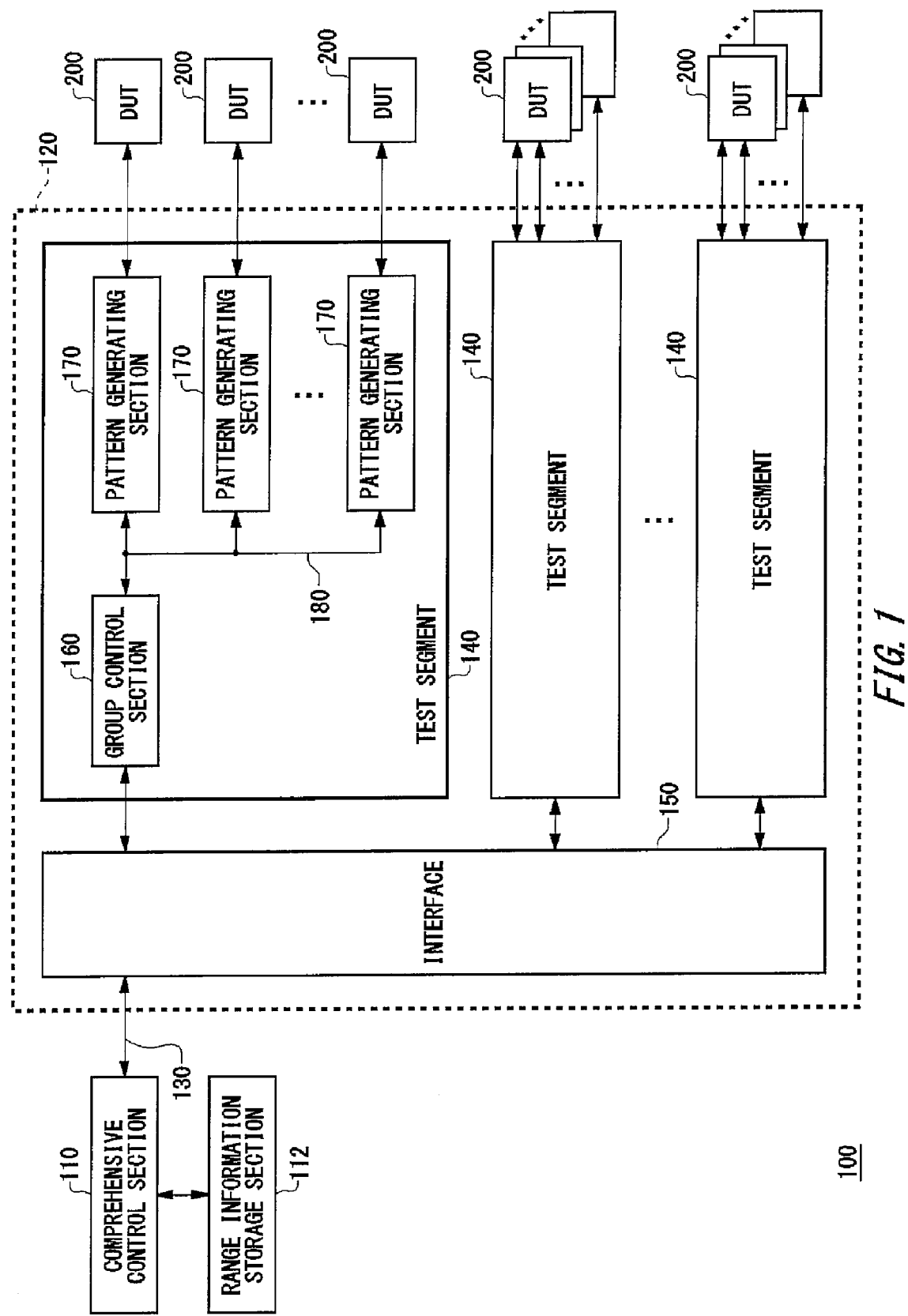
FIG. 1 shows example functional blocks of a test apparatus 100 according to the present embodiment, together with DUTs 200 or devices under test.

FIG. 1 shows example functional blocks of a test apparatus 100 according to the present embodiment, together with DUTs 200 or devices under test. The test apparatus 100 includes a comprehensive control section 110, a range information storage section 112, a test module 120, and a standard bus 130. The test module 120 includes a plurality of test segments 140 and an interface 150. The test segments 140 each include a group control section 160, pattern generating sections 170, and an internal bus 180.

The comprehensive control section 110 controls the test module 120 by sending and receiving data to and from the test module 120 via the standard bus 130. The comprehensive control section 110 may be an information processor such as a computer that operates on a software program. When the comprehensive control section 110 operates on software, the testing sequence is freely programmable. The comprehensive control section 110 may also be a controller provided at a stage between a computer system as described above and the test module 120.

The range information storage section 112 stores range information for designating the range of pattern generating sections 170, out of the plurality of pattern generating sections 170, that serve to test one independent DUT 200. The range of pattern generating sections 170 that serve to test one independent DUT 200 may include a single pattern generating section 170, when each DUT 200 is to be tested by a single pattern generating section 170. The range may include four pattern generating sections 170, when one independent DUT 200 is to be tested by four pattern generating sections 170. For example, the test module 120 may receive the range of pattern generating sections 170 that serve one independent DUT 200.

The comprehensive control section 110 may include the range information storage section 112.

The test module 120 tests the DUTs 200 under the control of the comprehensive control section 110. The test module 120 can be equipped with any suitable functionality adapted to the type of the DUTs 200. For example, when the DUTs 200 are logic circuits, dynamic random access memories (DRAMs), electrically erasable and programmable read-only memories (EEPROMs), analog circuits, or the like, the test module 120 can be specially tasked for logic circuits, DRAMs, EEPROMs, analog circuits, or the like. FIG. 1 shows only one test module 120, but a plurality of test modules 120, or even a plurality of functionally-different test modules 120 may be connected to the standard bus 130 as long as they are compatible with the standard bus 130 to be able to send and receive data thereon and are controlled by the comprehensive control section 110.

The standard bus 130 transfers control data from the comprehensive control section 110 to the test module 120. Reversely, the standard bus 130 transfers test data acquired by the test module 120 to the comprehensive control section 110. As stated above, a plurality of functionally-different test modules 120 can be connected to the standard bus 130. As long as compatible with the standard bus 130, test modules 120 of any different types may be used together. The standard bus 130 complies with a protocol by which these arbitrary test modules 120 can communicate with the bus 130.

The test segments 140 each define a range of pattern generating sections 170 to be controlled by a single group control section 160. The number of pattern generating sections 170 included in a test segment 140 can be selected among numbers suitable for testing the DUTs 200. The pattern generating sections 170 included in a test segment 140 generate the same pattern sequence. However, the test apparatus 100 according to the present embodiment controls the pattern generating sections 170 included in a test segment 140 to generate the pattern sequence at independent timings.

The test segments 140 send and receive data to and from the comprehensive control section 110 via the interface 150. The interface 150 is compatible with the protocol obeyed by the standard bus 130.

A single group control section 160 is included in each test segment 140 and controls the pattern generating sections 170 included in the test segment 140. The group control section 160 communicates with the comprehensive control section 110 via the interface 150. The group control section 160 is controlled by the comprehensive control section 110, and under this control, in turn controls the whole test segment 140 including the pattern generating sections 170.

The group control section 160 controls a group of some pattern generating sections 170 out of the plurality of pattern generating sections 170, and generates a control signal upon receiving a signal output from any pattern generating section 170 under its control. For example, upon receiving a fail signal generated by any pattern generating section 170, the group control section 160 generates a control signal corresponding to the fail signal and sends it to the comprehensive control section 110.

In this case, the comprehensive control section 110, which has received the control signal from the group control section 160, identifies any pattern generating section 170 that supplies a test pattern to the same one DUT 200 as that to which the pattern generating section 170 having output the signal supplies the test pattern, based on the range information in the range information storage section 112. Then, in response to the control signal, the comprehensive control section 110 controls the operation of any other group control section 160 that controls the pattern generating section 170 identified based on the range information.

The pattern generating section 170 generates a test pattern to be supplied to the DUT 200, which is one example of device under test. A plurality of pattern generating sections 170 are included in one test segment 140. That is, one group control section 160 controls a plurality of pattern generating sections 170.

The internal bus 180 transfers data from the group control section 160 to the pattern generating sections 170. Typical data to be transferred include, for example, fundamental test pattern data to form the test pattern, or instruction information that instructs the order in which the fundamental test pattern data are decoded.

Figure 2:
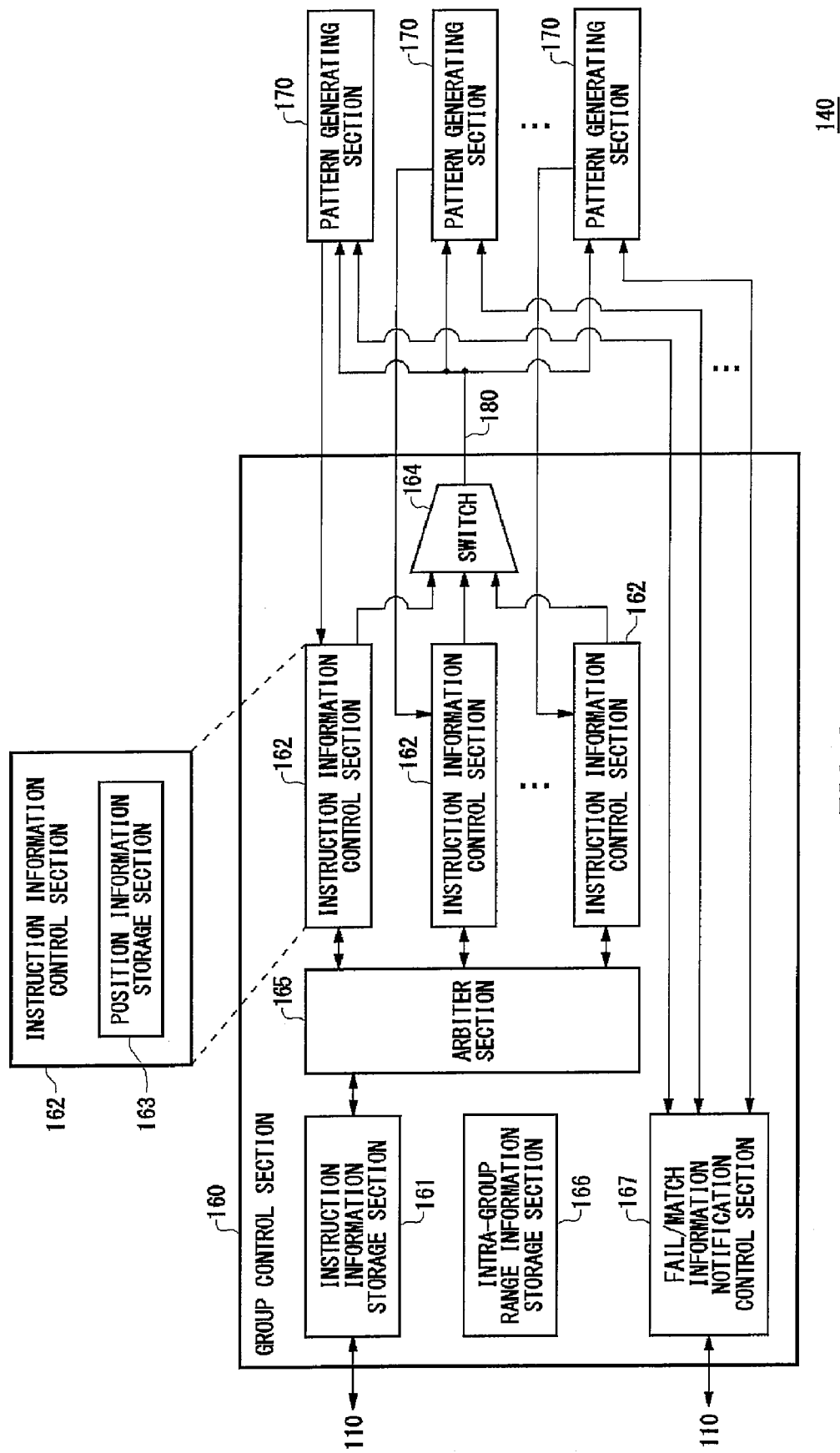
FIG. 2 shows example functional blocks of a test segment 140.

FIG. 2 shows example functional blocks of the test segment 140. FIG. 2 particularly shows example functions of the group control section 160 in detail. The group control section 160 includes an instruction information storage section 161, instruction information control sections 162, a switch 164, an arbiter section 165, an intra-group range information storage section 166, and a fail/match information notification control section 167. The instruction information control sections 162 each include a position information storage section 163.

Figure 3:
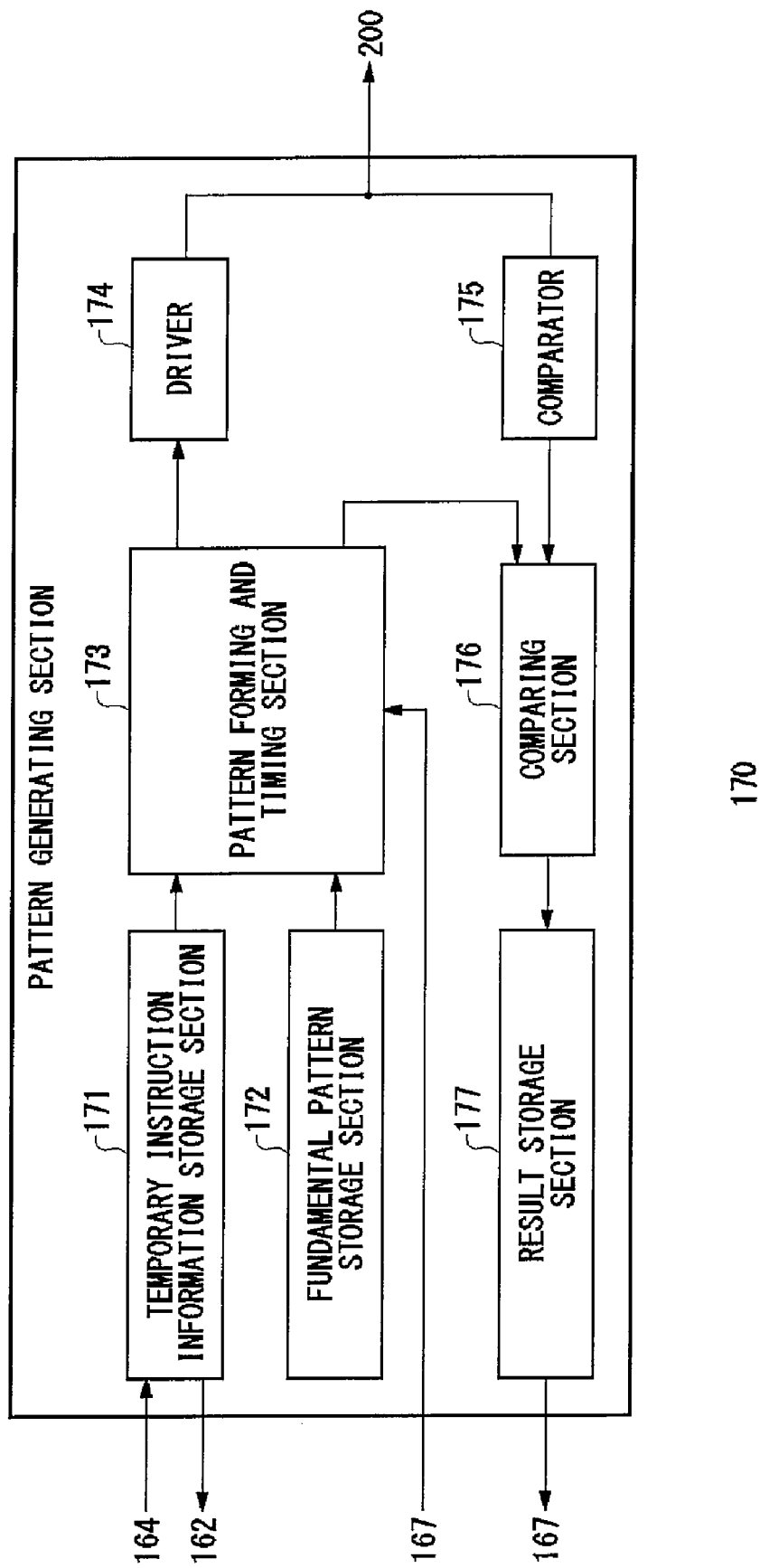
FIG. 3 shows example functional blocks of a pattern generating section 170.

FIG. 3 shows example functional blocks of the pattern generating section 170. The pattern generating section 170 includes a temporary instruction information storage section 171, a fundamental pattern storage section 172, a pattern forming and timing section 173, a driver 174, a comparator 175, a comparing section 176, and a result storage section 177.

The fundamental pattern storage section 172 stores fundamental patterns in the form of data. The fundamental patterns may be the unit of the test pattern. It is possible to generate the test pattern by decoding a plurality of test patterns in turn to form a sequence of patterns. The fundamental pattern storage section 172 is provided in each pattern generating section 170. However, where a plurality of pattern generating sections 170 use the same fundamental patterns in common, the fundamental pattern storage section 172 may be provided external to the pattern generating sections 170 and shared among the plurality of pattern generating sections 170.

The instruction information storage section 161 stores instruction information that instructs the order in which the fundamental patterns are decoded. The instruction information stored in the instruction information storage section 161 may include, for example, the list of the fundamental patterns. It is possible to generate a complex test pattern by decoding the fundamental patterns in the order in which they are listed. Further, by listing the fundamental patterns according to the instruction information, it is possible to decode the fundamental patterns consecutively and generate a seamless continuous test pattern.

The temporary instruction information storage section 171 temporarily stores part of the instruction information. The temporary instruction information storage section 171 is provided in the pattern generating section 170, and retains the most recent list of the fundamental patterns that are to be decoded by the pattern generating section 170. The temporary instruction information storage section 171 may be, but not limited to, a first-in first-out buffer (FIFO). For example, the temporary instruction information storage section 171 may be a memory that is addressable by means of register addresses. The temporary instruction information storage section 171 may be a cache memory such as an SRAM.

The instruction information control section 162 controls reading the instruction information. The instruction information control section 162 includes the position information storage section 163, and reads out the instruction information based on the position information stored in the position information storage section 163. That is, the instruction information control section 162 reads out part of the instruction information stored in the instruction information storage section 161, beginning at a reading position indicated by the position information stored in the corresponding one of the plurality of position information storage sections 163. The instruction information control section 162 then stores the read instruction information in the temporary instruction information storage section 171.

As stated above, the position information storage sections 163 store the positions from which to read the instruction information, for the pattern generating sections 170 respectively. To be more specific, each position information storage section 163 independently stores, in association with a corresponding one of the plurality of pattern generating sections 170, the position information that indicates the reading position from which to read the instruction information stored in the instruction information storage section 161 provided in common to the plurality of pattern generating sections 170.

The arbiter section 165 arbitrates reading requests generated by the plurality of instruction information control sections 162 when they are to read out their part of the instruction information from the instruction information storage section 161. The switch 164 connects each instruction information control section 162 to its corresponding pattern generating section 170 to control the data transfer on the internal bus 180. The switch 164 may be a hardware component, or a software switching function.

The pattern forming and timing section 173 generates the test pattern by decoding the data in the order of the fundamental patterns designated by the instruction information. The pattern forming and timing section adjusts the timing at which the generated test pattern is output.

The driver 174 outputs the test pattern output from the pattern forming and timing section 173 as the signal to supply to the DUT 200. The comparator 175 compares a signal to be output from the DUT 200 in response to the test pattern with a reference voltage, and converts the signal to a logical value.

The comparing section 176 compares the output from the comparator 175 with an expectation value. That is, the comparing section 176 compares an expectation value pattern, expected to be output from the DUT 200 when the DUT 200 is supplied with the test pattern with the output pattern actually output from the DUT 200 when the DUT 200 is supplied with the test pattern. The comparing section 176 may detect a mismatch between the expectation value pattern and the output pattern as a fail.

The comparing section 176 generates fail information when it detects as a result of comparison that the output pattern and the expectation value pattern do not match, and the pattern generating section 170 can signal the fail information to the group control section 160. The comprehensive control section 110 receives the fail information as a control signal from the group control section 160, and can control any other group control section 160 to stop any other pattern generating section 170 that is controlled by this group control section 160.

By this control, it is possible to quit, at an earlier time, the test on any DUT 200 that is not worth further testing, and to improve the efficiency of testing. As long as pattern generating sections 170 connected to one independent DUT 200 are all included in the same test segment 140, the group control section 160 can stop the test. However, the test apparatus 100 of the present embodiment can connect more than one of its test segments 140 to one DUT 200. Even if any DUT 200 is connected to more than one test segments 140, the comprehensive control section 110 can stop any appropriate ones of the pattern generating sections 170.

The result storage section 177 stores the result of the test including the fail information detected by the comparing section 176. The result storage section 177 is provided independently in each of the plurality of pattern generating sections 170. By providing the result storage section 177 in each pattern generating section 170, it is possible to accommodate the case that one independent DUT 200 is assigned to each pattern generating section 170, where the test result needs to be stored or read independently. The fail/match information notification control section 167 receives a fail signal or the like from the result storage section 177, and notifies a control signal to the comprehensive control section 110.

The comprehensive control section 110 receives fail information from the group control section 160, and can control any other group control section 160 to store the fail information in the result storage section 177 of any pattern generating section 170 that is controlled by this group control section 160. This makes it possible to implement a process to cope with a fail, on any pattern generating section 170 that is controlled by any other group control section 160.

When DUTs 200 that are each supplied with the test pattern from any of a plurality of pattern generating sections 170 controlled by any group control section 160 should be all stopped from being tested, the comprehensive control section 110 can control this group control section 160 to stop all the pattern generating sections 170 controlled by the group control section 160. This makes it possible to appropriately stop any pattern generating sections 170 that need not further operate.

The pattern generating section 170 can notify the group control section 160 of a match signal, which is generated when the output pattern output from the DUT 200 in response to the test pattern satisfies a predetermined condition. The comprehensive control section 110 receives the match signal from the group control section 160, and can control any other group control section 160 to cause any other pattern generating section 170 controlled by this group control section 160 to perform a predetermined operation prepared for when the predetermined condition is satisfied. The match signal can be received by the result storage section 177 and notified to the comprehensive control section 110 by the fail/match information notification control section 167.

Intra-group range information that indicates the range of pattern generating sections 170, out of the pattern generating sections 170 controlled by any group control section 160, that serve to test any other independent DUT 200 is stored. The group control section 160 can therefore identify any pattern generating section 170 that supplies the test pattern to any other independent DUT 200 based on the intra-group range information stored in the intra-group range information storage section 166. That is, the group control section 160 receives a signal from any pattern generating section 170, and can identify any other pattern generating section 170 that is controlled by the group control section 160 and that supplies the test pattern to the same DUT 200 as that to which the pattern generating section 170 having output the signal supplies the test pattern, based on the intra-group range information. Then, in response to the signal, the group control section 160 can control the pattern generating section 170 that is controlled by itself and identified based on the intra-group range information.

The signal from the pattern generating section 170 may be, for example, fail information or a match signal. In response to the signal, the group control section 160 can perform control to cope with fail information or control to cope with a match signal as described above.

As described above, even when a plurality of pattern generating sections 170 belonging to different test segments 140 test one independent DUT 200, appropriate control is available according to a fail status or match status. Particularly, the test apparatus 100 according to the present embodiment allows the pattern generating sections 170 to generate the test pattern independently, and can conduct the test by selecting a range of pattern generating sections 170 that does not necessarily coincide exactly with any test segment 140. The test apparatus 100 achieves a great advantage from its ability to effect an appropriate event control even when a plurality of pattern generating sections 170 belonging to different test segments 140 test one independent DUT 200. That is, the test apparatus 100 can test DUTs 200 of multiple types and improve the flexibility of testing.

Where pattern generating sections 170 in a given group test independent DUTs 200 according to the intra-group range information in the intra-group range information storage section 166, the group control section 160 is the control tier to effect an appropriate control according to a fail status or match status. Here, no control signal needs to be sent to the comprehensive control section 110, and the control can be simplified.

Figure 4:
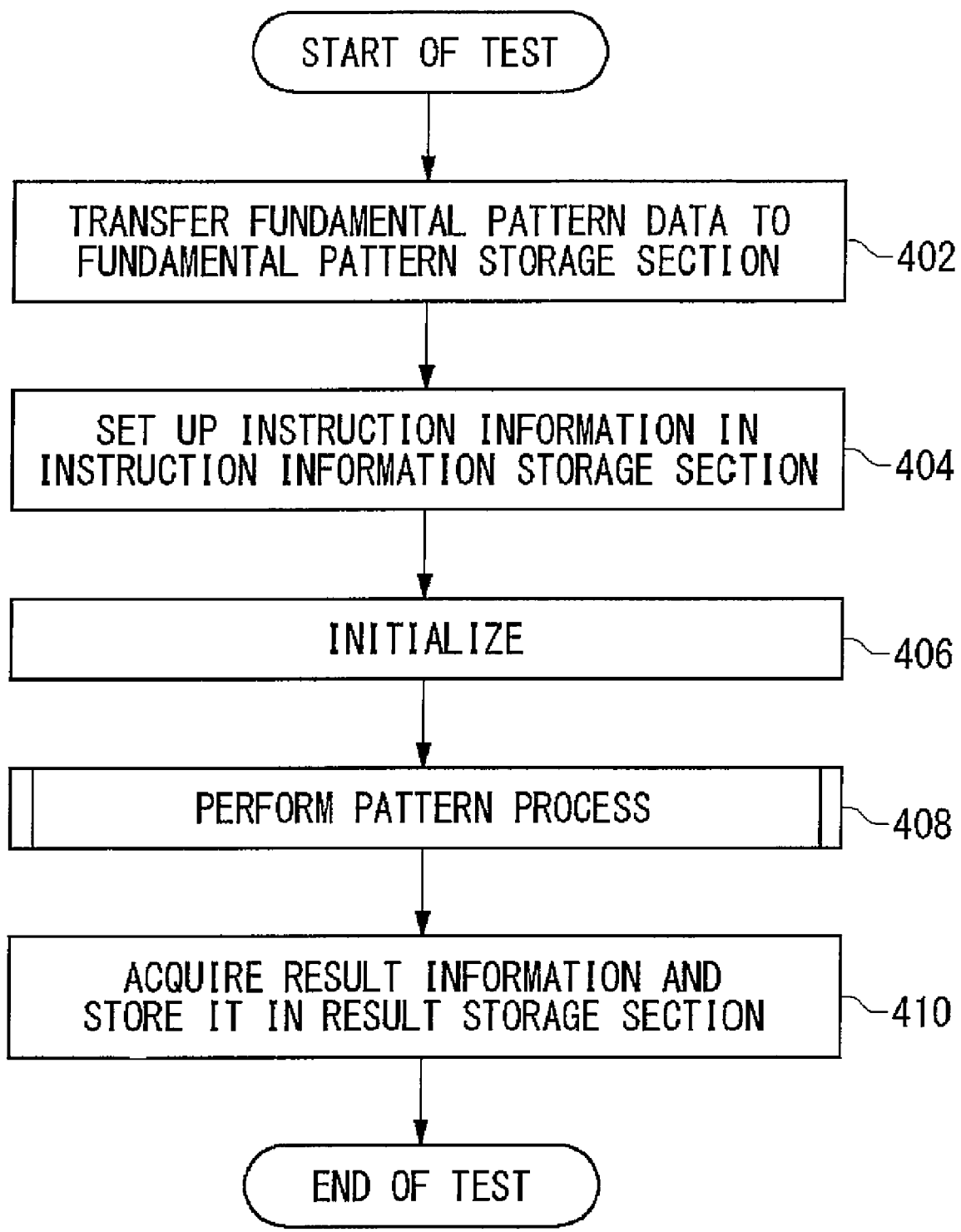
FIG. 4 shows an example flow of testing by the test apparatus 100 according to the present embodiment.

FIG. 4 shows an example flow of testing by the test apparatus 100. Upon starting a test, the test apparatus 100 first stores fundamental pattern data in the fundamental pattern storage section 172 (step 402). The test apparatus 100 then stores instruction information in the instruction information storage section 161 (step 404). Then, the test apparatus 100 initializes each section including the pattern generating sections 170 (step 406).

After the initialization, the test apparatus 100 performs a pattern process (step 408). When finished with the pattern process, the test apparatus 100 acquires result information and stores it in the result storage section 177 (step 410). The test apparatus 100 then terminates the test. After the test is completed, it is possible to read out the test result from the result storage section 177 if necessary, for confirmation, analysis, etc.

Figure 5:
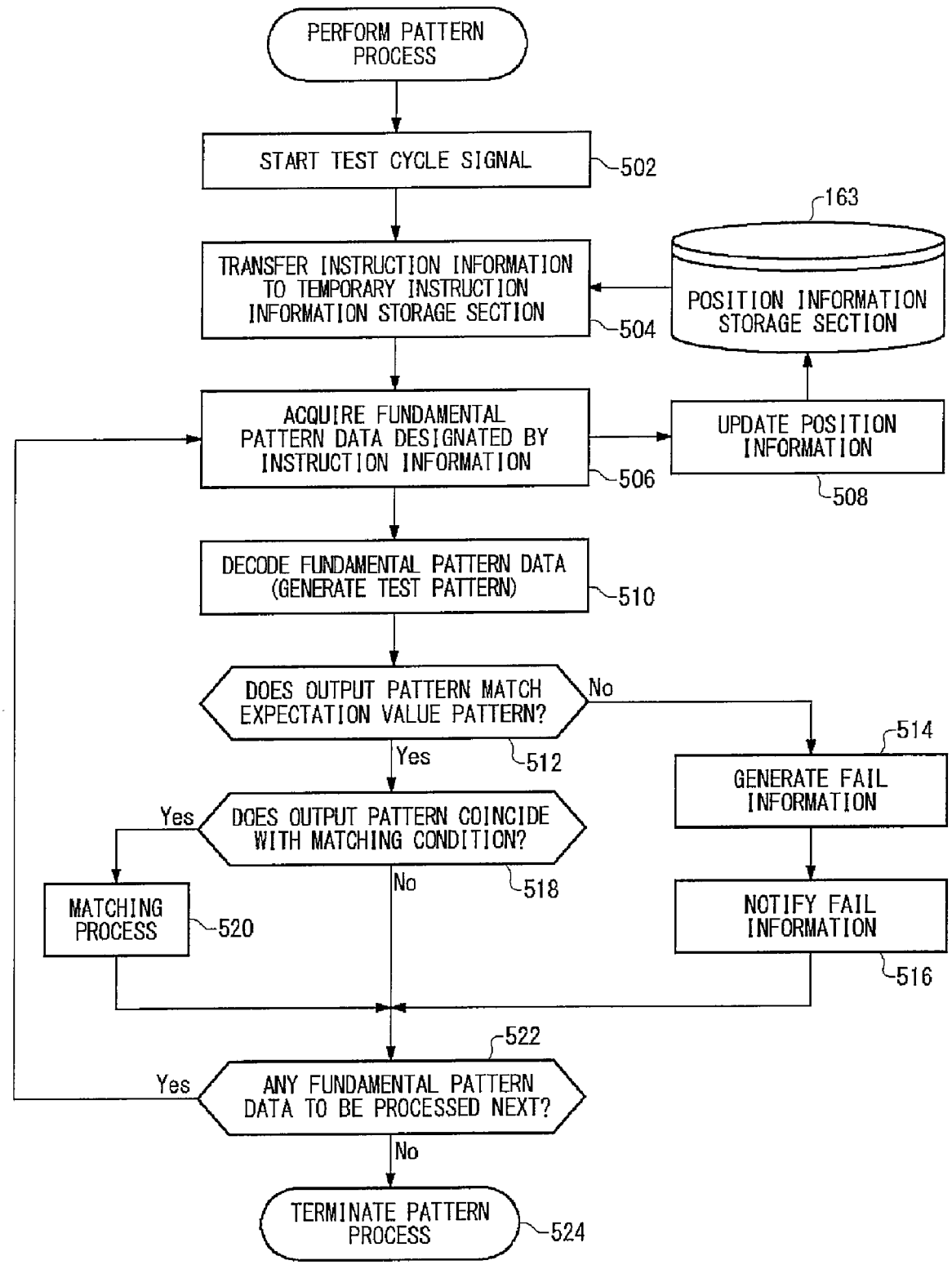
FIG. 5 shows an example flow of a pattern process.

FIG. 5 shows an example flow of the pattern process. When the pattern process is started, first, a test cycle signal is started (step 502), and the instruction information is transferred to the temporary instruction information storage section 171 (step 504). Here, the position information in the position information storage section 163 is referred to. Note that the instruction information can be transferred to the temporary instruction information storage section 171 any time a free memory space is available in the temporary instruction information storage section 171, i.e., the instruction information can be transferred independently from the operations from step S506.

Next, fundamental pattern data designated by the instruction information is acquired (step 506). Once the fundamental pattern data is acquired, the instruction information concerned is no more necessary, so the position information is updated (step 508).

Then, the acquired fundamental pattern data is decoded (step 510). The data can be decoded in the following manner. The circuit may be configured to retain fundamental pattern data, i.e., the pattern sequence of the fundamental pattern and write the fundamental pattern data in, for example, a cache memory to output the pattern sequence as the test pattern. Alternatively, the circuit may retain a data table that indicates the correspondence between default pattern sequences and identification information of the default pattern sequences, and describe the identification information in the fundamental pattern data. In this case, the circuit may be configured to detect any identification information, write the pattern sequence specified by the detected identification information in the cache memory, and output the written pattern sequence as the test pattern.

The output test pattern is input to the DUT 200, and it is judged whether a pattern output from the DUT 200 matches the expectation value pattern (step 512). When they do not match (step 512; No), fail information is generated (step 514), and notified to the group control section 160 or the comprehensive control section 110 (step 516).

When the output pattern of the DUT 200 matches the expectation value pattern (step 512; Yes), it is judged whether the output pattern coincides with a matching condition (step 518). When they coincide (step 518; Yes), a predetermined matching process is performed (step 520). When they do not coincide (step 518; No), the flow proceeds to a step of judging whether there is any fundamental pattern to be processed next.

It is judged whether there is any fundamental pattern data to be processed next (step 522), and if there is any (step 522; Yes), the step 506 and steps thereafter are again performed. If there is no fundamental pattern to be processed next (step 522; No), the pattern process is terminated (step 524).

According to the test apparatus 100 described above, even when pattern generating sections 170 belonging to different test segments 140 test one independent DUT 200, fail control for stopping the pattern generating sections 170, etc. is appropriately effected on the plurality of test segments 140 concerned. Therefore, the flexibility and hence the utilization efficiency of the test apparatus 100 can be improved. Particularly, the test apparatus 100 can effectively be used when DUTs 200 of various types are to be tested at a time.

Although some aspects of the present invention have been described by way of exemplary embodiments, the technical scope of the present invention is not limited to the range of disclosure of the above embodiment. Various modifications or alterations can be made upon the above-described embodiment. It is apparent from the claims that embodiments including such modifications or alterations also fall within the technical scope of the present invention.

As apparent from the above description, according to one embodiment of the present invention, it is possible to realize a test module, test apparatus and test method with high utilization efficiency of the pattern generating sections 170.

What is claimed is:

1. A test apparatus, comprising:
a plurality of pattern generating sections that generate a test pattern to supply to devices under test;
a group control section that controls a group of pattern generating sections out of the plurality of pattern generating sections, and generates a control signal upon receiving a signal output from any pattern generating section controlled by itself;
a range information storage section that stores range information indicating a range of pattern generating sections, out of the plurality of pattern generating sections, that serve to test one independent device under test; and
a comprehensive control section that receives the control signal from the group control section, identifies any other pattern generating section that supplies the test pattern to the same one device under test to which the pattern generating section having output the signal supplies the test pattern, based on the range information, and in response to the control signal, controls any other group control section that controls the any other pattern generating section.

2. The test apparatus according to claim 1, wherein:
each of the pattern generating sections includes a comparing section that compares an expectation value pattern, expected to be output from the device under test when the device under test is supplied with the test pattern, with an output pattern actually output from the device under test when the device under test is supplied with the test pattern,
each of the group of pattern generating sections notifies the group control section of the signal, which is fail information generated when the comparing section detects as a result of comparison that the expectation value pattern and the output pattern do not match, and
upon receiving the control signal, which is the fail information, from the group control section, the comprehensive control section controls the any other group control section to stop the any other pattern generating section controlled by the any other group control section.

3. The test apparatus according to claim 2, comprising a result storage section in each of the plurality of pattern generating sections that stores a test result including the fail information,
wherein the comprehensive control section receives the fail information from the group control section, and controls the any other group control section to store the fail information in the result storage section in any pattern generating section controlled by the any other group control section.

4. The test apparatus according to claim 2,
wherein when more than one of the devices under test that are each supplied with the test pattern from any of the group of pattern generating sections controlled by the group control section should be all stopped from being tested, the comprehensive control section controls the group control section to stop all the pattern generating sections controlled by the group control section.

5. The test apparatus according to claim 1, wherein:
each of the group of pattern generating sections notifies the group control section of the signal, which is a match signal generated when an output pattern output from the device under test in response to the test pattern satisfies a predetermined condition, and
upon receiving the match signal from the group control section, the comprehensive control section controls the any other group control section to cause the any other pattern generating section controlled by the any other group control section to perform a predetermined operation prepared for when the predetermined condition is satisfied.

6. The test apparatus according to claim 1, further comprising an intra-group range information storage section that stores intra-group range information indicating a range of pattern generating sections, out of the pattern generating sections controlled by the group control section, that serve to test any other independent device under test,
wherein upon receiving the signal from the pattern generating section, the group control section identifies any other pattern generating section that is controlled by the group control section and that supplies the test pattern to the same any other device under test as that to which the pattern generating section having output the signal supplies the test pattern, based on the intra-group range information, and in response to the signal, controls the any other pattern generating section controlled by the group control section.

7. A test method, comprising:

a pattern generating step of generating a plurality of test patterns to supply to devices under test, where the generating is performed by a plurality of pattern generating sections;

a group controlling step of controlling a group of pattern generating sections out of the plurality of pattern generating sections, and generating a control signal upon receiving a signal output from any pattern generating section controlled, where the controlling and the generating are performed by a group control section;

a range information storing step of storing range information indicating a range of pattern generating sections, out of the plurality of pattern generating sections, that serve to test one independent device under test; and a comprehensive controlling step of receiving the control signal generated in the group controlling step, identifying any other pattern generating section that supplies the test pattern to the same one device under test as that to which the pattern generating section having output the signal supplies the test pattern, based on the range information, and in response to the control signal, controlling any other group control section that controls the any other pattern generating section.

\* \* \* \* \*